(12) United States Patent
Stadius et al.

(10) Patent No.: US 10,270,551 B2
(45) Date of Patent: Apr. 23, 2019

(54) MIXING CONSOLE WITH SOLO OUTPUT

(71) Applicant: Digico (UK) Ltd, Surrey (GB)

(72) Inventors: John Stadius, Surrey (GB); Roger Wood, Surrey (GB)

(73) Assignee: Digico (UK) Ltd, Surrey (GB)

( * ) Notice: Subject to any disclaimer, the term of this patent is extended or adjusted under 35 U.S.C. 154(b) by 0 days.

(21) Appl. No.: 15/532,651

(22) PCT Filed: Dec. 4, 2015

(86) PCT No.: PCT/GB2015/053722
§ 371 (c)(1),
(2) Date: Jun. 2, 2017

(87) PCT Pub. No.: WO2016/087875
PCT Pub. Date: Jun. 9, 2016

(65) Prior Publication Data
US 2017/0359135 A1    Dec. 14, 2017

(30) Foreign Application Priority Data

Dec. 4, 2014 (GB) .................................. 1421583.4

(51) Int. Cl.
| | |
|---|---|
| *H04H 60/04* | (2008.01) |
| *H03G 3/18* | (2006.01) |
| *H03G 5/16* | (2006.01) |
| *H04R 3/04* | (2006.01) |
| *H04R 5/04* | (2006.01) |

(52) U.S. Cl.
CPC .............. *H04H 60/04* (2013.01); *H03G 3/18* (2013.01); *H03G 5/165* (2013.01); *H04R 3/04* (2013.01); *H04R 5/04* (2013.01)

(58) Field of Classification Search
CPC ............ H04H 60/04; H03G 3/02; H03G 3/18; H03G 5/165; H04R 3/04; H04R 5/04
See application file for complete search history.

(56) References Cited

U.S. PATENT DOCUMENTS

| | | | |
|---|---|---|---|
| 6,574,685 B1 | 6/2003 | Schwartz et al. | |
| 7,936,889 B2 * | 5/2011 | Aiso | ...................... H04H 60/04 369/4 |

(Continued)

OTHER PUBLICATIONS

United Kingdom Intellectual Property Office (UKIPO), Patents Act 1977: Search Report Under Section 17, Great Britain Patent Application Serial No. GB1421583.4 (1421583.4), dated Jun. 4, 2015.

(Continued)

*Primary Examiner* — Jason R Kurr
(74) *Attorney, Agent, or Firm* — Reichel Stohry LLP; Natalie J. Dean; Mark C. Reichel

(57) ABSTRACT

In live music performances it is desirable for a mixing console operator to be able to hear the result of all the processing of a single input signal provided by the various processing steps without the other input signals being present. This is achievable by providing a console (10) which processes an input signal independently of other input signals to produce an operator output signal (210), wherein the processing is arranged to be identical to that applied in combination to the same signal as it is processed, in combination with other signals, for the creation of an output mix (180).

16 Claims, 2 Drawing Sheets

(56) References Cited

U.S. PATENT DOCUMENTS

| | | | |
|---|---|---|---|
| 8,155,350 B2* | 4/2012 | Suyama | H04R 27/00 |
| | | | 381/119 |
| 8,913,763 B2* | 12/2014 | Okabayashi | H04H 60/04 |
| | | | 381/119 |
| 2007/0067055 A1 | 3/2007 | Terada | |
| 2011/0033067 A1* | 2/2011 | Okabayashi | H04H 60/04 |
| | | | 381/119 |

OTHER PUBLICATIONS

United Kingdom Intellectual Property Office (UKIPO), Patents Act 1977: Examination Report Under Section 18(3), Great Britain Patent Application Serial No. GB1421583.4 (1421583.4), dated Feb. 1, 2017.

International Searching Authority, International Search Report, PCT Patent Application Serial No. PCT/GB2015/053722, dated Mar. 10, 2016.

International Searching Authority, Written Opinion of the International Searching Authority, PCT Patent Application Serial No. PCT/GB2015/053722, dated Mar. 10, 2016.

* cited by examiner

MIXING CONSOLE WITH SOLO OUTPUT

PRIORITY

The present application is related to, and claims the priority benefit of, and is a 35 U.S.C. 371 national stage application of, International Patent Application Serial No. PCT/GB2015/053722, filed Dec. 4, 2015, which is related to, and claims the priority benefit of, Great Britain Patent Application Serial No. 1421583.4, filed Dec. 4, 2014. The contents of each of these applications are hereby incorporated by reference in their entirety into this disclosure.

TECHNICAL FIELD

The present invention relates generally to a mixing console and a method of using the console, and finds particular, although not exclusive, utility in audio mixing, and in live music mixing.

BACKGROUND

Typically, a mixing console (also known as an audio mixer, mixing desk, audio production console and soundboard) is a device for combining (also known as mixing or summing) audio signals.

Mixing consoles are used extensively in the entertainment industry, and have many applications, e.g. in recording studios, sound reinforcement systems, public address systems, broadcasting, radio, television, film post-production, and at live concerts.

In use, a mixing console is provided with at least two audio input signals, each signal being directed to an input channel of the console. The input signals may be analogue or digital. The mixing console may be able to mix those input signals together to produce one or more combined output signals. A mixing console may apply one or more pre mixing processes to an input signal prior to mixing with any other input signal or signals. Also, the mixing console may apply one or more post-mixing processes to any of the combined output signals. The mixing console has means to direct one of the combined output signals to an output source, such as an amplifier, speakers, headphones, monitor or a recording device. When an output signal is transmitted to an audience, this signal is often known as the "main" or "master" output signal. The term 'audience' is intended to refer to anyone (or anything, such as a recording device) that is intended to receive the main output signal, but is not generally actively involved in the creation/production of the input signals and/or operation of the mixing console.

However, the mixing console may also provide an output signal that is not intended for an audience, but is instead intended for one or more reviewers (e.g. one or more performers, musicians, singers etc. and/or console operators). This may be directed to a monitor speaker and/or headphones. Such an output signal is often known as the "auxiliary mix". This is useful, for example, where one performer wants to be able to hear one or more of the other performers more clearly.

For example, a mixing console would allow audio signals which originate from three performers (e.g. a singer, a drummer and guitarist) to be mixed together and heard through a set of speakers by the audience. The mixing console has an input to receive each performer's audio signal (e.g. via microphones connected to (or part of) the mixing console). The mixing console operator may apply one or more pre-mixing processes to each input signal, and/or one or more post-mixing processes to the combined input signals to create a master output signal and an auxiliary output signal.

The operator may apply these processes to each input signal and to the combined output signal to change the overall nature/quality of the combined output signal, with the purpose of obtaining an appealing, optimum or desired sound or sound effect.

The master output signal may be sent to the audience. The auxiliary output signal may be sent to an individual performer. This signal may be further processed independently of the master output signal prior to reaching the performer.

However, it is possible that the performer is not satisfied with the nature of this auxiliary output signal and, in particular, the way in which one of the input signals, from one of the performers, is being processed. In this case, the console operator is only able to hear via his or her own headphones either each individual input signal, either unprocessed or after initial processing, the auxiliary output signal directed to the performer, or the master output mix and it is therefore difficult for the operator to identify in what way the processing could be changed in response to the performer's concerns.

This is particularly problematic at a live concert where there is a great deal of pressure to resolve any perceived problem with the combined output signal, so as to provide the audience, often fee paying, with the best experience possible.

The more input signals the mixing console has to process at any one time, the more challenging it becomes for the operator to provide a master output signal which has an appealing, optimum or desired quality, and to provide satisfactory auxiliary output signals for each of the performers.

There remains a need to be able to optimise the output signals, and in particular to be able to identify and correct any perceived problem with the master output signal and/or the auxiliary output signals.

BRIEF SUMMARY

According to a first aspect of the invention, there is provided a mixing console comprising first and second input channels, the first input channel comprising receiving means arranged to receive a first input signal, and a first primary processing means arranged to initially process the first input signal and provide at least two first identical output signals; the second input channel comprising receiving means arranged to receive a second input signal, and a second primary processing means arranged to initially process the second input signal and provide at least two second identical output signals; the console further comprising at least one output channel comprising at least a first and second secondary processing means, the first secondary processing means arranged to process the first output signal from the first input channel and produce a first tertiary output signal; the second secondary processing means arranged to process the first output signal from the second input channel and produce a second tertiary output signal; the at least one output channel further comprising a tertiary processing means arranged to combine and process the first and second tertiary output signals to produce a first output mix; wherein the mixing console further comprises a quaternary processing means arranged to receive the second output signal from the first input channel and process it in an identical way to a combination of the processing provided by the first secondary processing means and the tertiary processing means to provide an operator output signal.

In this way, the operator output signal is the same as the particular input signal after it has been processed by the primary, secondary and tertiary processing means but without the other input signals present. This allows the operator finer control over the processing as the other input signals are removed allowing greater clarity of a particular input signal.

Either or both of the first and second secondary processing means may be arranged to only effect the gain of the first and/or second output signals from the first and/or second input channels.

Alternatively, either or both of the first and second secondary processing means may be arranged to effect the gain and other characteristics of the first and/or second output signals from the first and/or second input channels.

The term 'characteristics' of any signal, mix or output, may relate to how the signal, mix or output, sounds as an audio output. For instance, a characteristic may be any one or more of frequency, amplitude, bass, treble, pitch, quality, harmonic, overtone, reverberation, echo, wave shape, background noise, pressure, intensity, direction, dynamics, equalisation, tone and timbre.

The quaternary processing means may be arranged to automatically mimic the combination of the processing provided by the first secondary processing means and the tertiary processing means. In this way, if the setting of the second and/or third processing means is/are adjusted the settings of the quaternary processing means are also automatically adjusted to match these new settings. Therefore, in use, when an operator wants to listen to a "true solo" for any particular input signal he knows that what he will be listening to will have been processed in exactly the same way as the output mix, but for just one input signal.

The first output mix may be an auxiliary output mix. Alternatively, it may be a master output mix.

The mixing console may further comprise a set of controls for arranging the processing of the processing means. The same set of controls may be used to vary the arrangement of each of the processing means. In this way, the operator may select which input signal to apply processing to and which processing to apply to it so as to mimic the processing in any particular input or output channel.

Such controls may include switches, faders, potentiometers, knobs, buttons, sliders, ports, touch pads, keyboards, mice and light pens). The same set of controls may be used to vary the arrangement of each of the processing means. In this way, only one set of controls may be required with a switch which allows the controls to be used by any one of the processing means.

The mixing console may further comprise memory means for saving and selectively recalling more than one arrangement of any of the processing means. The term "arrangement of any of the processing means" may also mean the arrangement of the controls.

The mixing console may further comprise transfer means for transferring the arrangements of any of the processing means to any other processing means.

Any or all of the processing means may be provided by a set of processors, comprising one or more processors. In this regard, the term "processor" may mean a silicon chip and a set of processors may be one or more silicon chips. The set of processors may also comprise means to combine signals.

Any or all of the processing means may be configured to be able to independently, or in combination, apply processes selected from the group including: attenuation; band curve selection; band-pass equalization; boosting; compression; delaying; valve emulation; dual insert points; dynamic equalisation; dynamic reshaping; echoing; equalization; fading; four-band parametric equalization; gating; high-pass equalization; high-pass filtration; level fluctuating; levelling; low-pass filtering; low-pass equalization; mixing; notch filter equalization; panning; reshaping; reverberation; shelf equalization; single and multi-channel pre-setting; and summing.

The mixing console may further comprise indicator means. These indicator means may comprise visual indicators and/or audio indicators such as one or more of a light, LED, VDU, headphones, speaker, monitor, whistle, bell and chime.

The input signals may comprise one or more of an instrument, vocals, a sample, a recording and other sound sources.

More than one output channel may be provided for independently (i.e. separately) processing output signals from the primary processing means provided for each input signal. Each output channel includes secondary and tertiary processing means to produce other "final" output mixes such as a master output mix, other auxiliary output mixes and so on.

It is contemplated that the receiving means of the mixing console provides various ways in which the input signals may be provided to the various channels of the mixing console, these receiving means being independently selected from the group including one or more of ports, plugs, sockets, connectors, wires, cables and by wireless connection.

It is contemplated that the means for saving and recalling provides various ways in which the process settings of the mixing console may be varied, stored, recovered and/or applied to the various channels of the mixing console. These means for saving and recalling may be independently selected from the group including one or more of saving means, processing means, recalling means, transferring means, computer processing means, algorithm means, hard drives, solid state memory, computer processor, any of which may be internal and/or external to the mixing console. When external, these may be connected via a wired connection, or via a wireless connection, and/or may be accessed via internet, mobile, or satellite connection, or which are in the cloud, or take place in the cloud.

According to a second aspect of the invention, there is provided a method of processing an input signal independently of other input signals to produce an operator output signal, comprising the steps of providing a mixing console according to the first aspect; transmitting at least a first and second input signal to the console; processing the first input signal with the first primary processing means to produce at least two first identical output signals; processing the second input signal with the second primary processing means to produce at least two second identical output signals; processing a first output signal from the first input channel to produce a first tertiary output signal; processing a first output signal from the second input channel to produce a second tertiary output signal; combining and processing the first and second tertiary output signals to produce a first output mix; processing the second output signal from the first input channel in an identical way to a combination of the processing which provided the first output mix, to thereby provide the operator output signal.

BRIEF DESCRIPTION OF THE DRAWINGS

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

DETAILED DESCRIPTION

Figure 1:
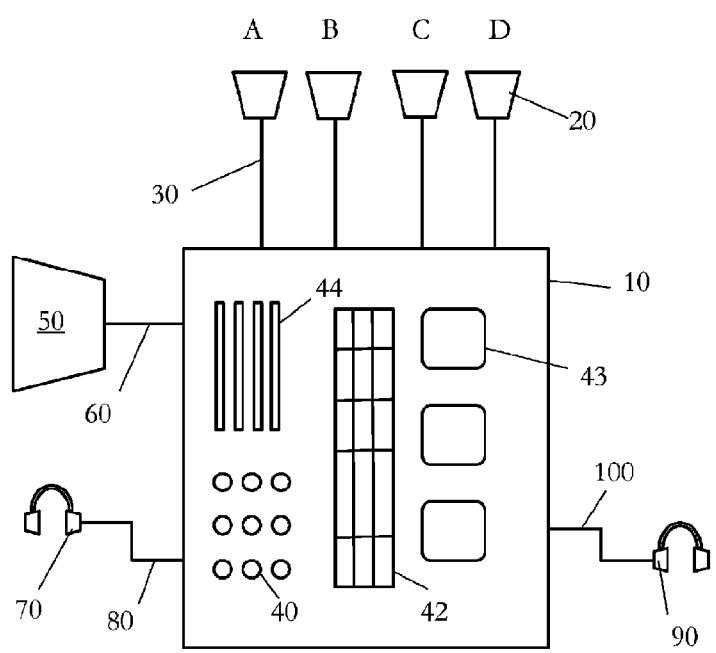
FIG. 1 is a schematic representation of a mixing console in use.

The present invention will be described with respect to certain drawings but the invention is not limited thereto but only by the claims. The drawings described are only schematic and are non-limiting. Each drawing may not include all of the features of the invention and therefore should not necessarily be considered to be an embodiment of the invention. In the drawings, the size of some of the elements may be exaggerated and not drawn to scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that operation is capable in other sequences than described or illustrated herein.

The 'first processing means' may also be referred to, or understood to be, the 'global processing means'.

The 'second processing means' may also be referred to, or understood to be, the 'nodal processing means'.

The 'third processing means' may also be referred to, or understood to be, the 'channel processing means'.

The 'quaternary processing means' may also be referred to, or understood to be, the 'true solo processing means'.

Moreover, the terms top, bottom, over, under and the like in the description and the claims are used for descriptive purposes and not necessarily for describing relative positions. It is to be understood that the terms so used are interchangeable under appropriate circumstances and that operation is capable in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Similarly, it is to be noticed that the term "connected", used in the description, should not be interpreted as being restricted to direct connections only. Thus, the scope of the expression "a device A connected to a device B" should not be limited to devices or systems wherein an output of device A is directly connected to an input of device B. It means that there exists a path between an output of A and an input of B which may be a path including other devices or means. "Connected" may mean that two or more elements are either in direct physical or electrical contact, or that two or more elements are not in direct contact with each other but yet still co-operate or interact with each other. For instance, wireless connectivity is contemplated.

Reference throughout this specification to "an embodiment" or "an aspect" means that a particular feature, structure or characteristic described in connection with the embodiment or aspect is included in at least one embodiment or aspect of the present invention. Thus, appearances of the phrases "in one embodiment", "in an embodiment", or "in an aspect" in various places throughout this specification are not necessarily all referring to the same embodiment or aspect, but may refer to different embodiments or aspects. Furthermore, the particular features, structures or characteristics of any embodiment or aspect of the invention may be combined in any suitable manner, as would be apparent to one of ordinary skill in the art from this disclosure, in one or more embodiments or aspects.

Similarly, it should be appreciated that in the description various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Moreover, the description of any individual drawing or aspect should not necessarily be considered to be an embodiment of the invention. Rather, as the following claims reflect, inventive aspects lie in fewer than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some features included in other embodiments, combinations of features of different embodiments are meant to be within the scope of the invention, and form yet further embodiments, as will be understood by those skilled in the art. For example, in the following claims, any of the claimed embodiments may be used in any combination.

In the description provided herein, numerous specific details are set forth. However, it is understood that embodiments of the invention may be practised without these specific details. In other instances, well-known methods, structures and techniques have not been shown in detail in order not to obscure an understanding of this description.

In the discussion of the invention, unless stated to the contrary, the disclosure of alternative values for the upper or lower limit of the permitted range of a parameter, coupled with an indication that one of said values is more highly preferred than the other, is to be construed as an implied statement that each intermediate value of said parameter, lying between the more preferred and the less preferred of said alternatives, is itself preferred to said less preferred value and also to each value lying between said less preferred value and said intermediate value.

The use of the term "at least one" may mean only one in certain circumstances.

The principles of the invention will now be described by a detailed description of at least one drawing relating to exemplary features of the invention. It is clear that other arrangements may be configured according to the knowledge of persons skilled in the art without departing from the underlying concept or technical teaching of the invention, the invention being limited only by the terms of the appended claims.

FIG. 1 is a schematic drawing of a mixing console 10. In this example, the mixing console is for receiving sound signals from performers, for processing those signals to provide an master output mix for the audience and auxiliary mix signals for at least one performer.

The sound sources are referenced "A", "B", "C" and "D". The sounds are received by microphones 20. These microphones are connected to the mixing console 10 by cables 30.

The console includes various controls 40, 42, 43, 44 for controlling its operation. For instance, a first set of controls may allow the console to process and/or combine a selected input signal from sources A, B, C, D or a group of selected input signals in a first manner. A second set of controls may allow the input signals from sources A, B, C, D to be processed and combined in a different manner.

A master mix output is transmitted via cable 60 to loudspeakers 50. This may be the combination of the input signals from sources A, B, C, D processed to provide an optimum output as determined by the operator of the console.

A pair of headphones 70 is also connected to the console 10 by another cable 80. These headphones may be worn by the mixing console operator. The operator may hear through these headphones a first true solo signal output from the console 10 which is a single input signal (for example, from one source A), which has been processed in the same way as it has been processed in the master mix output.

Another pair of headphones 90 is also connected to the console 10 by another cable 100. These headphones may be worn by one of the performers. They may receive an auxiliary mix from the console 10 which is a combination of all four input source signals A, B, C, D. However, the processing may be different from the processing creating the master output mix and the first true solo output. In this example the processing is reducing the bass of one of the performer's output signals and changing the dynamic range of another of the performer's output signals.

Although only two outputs are shown from the console 10 it is capable of providing many more, each including a different or similar combination of input signals and different or similar processing applied thereto.

Figure 2:
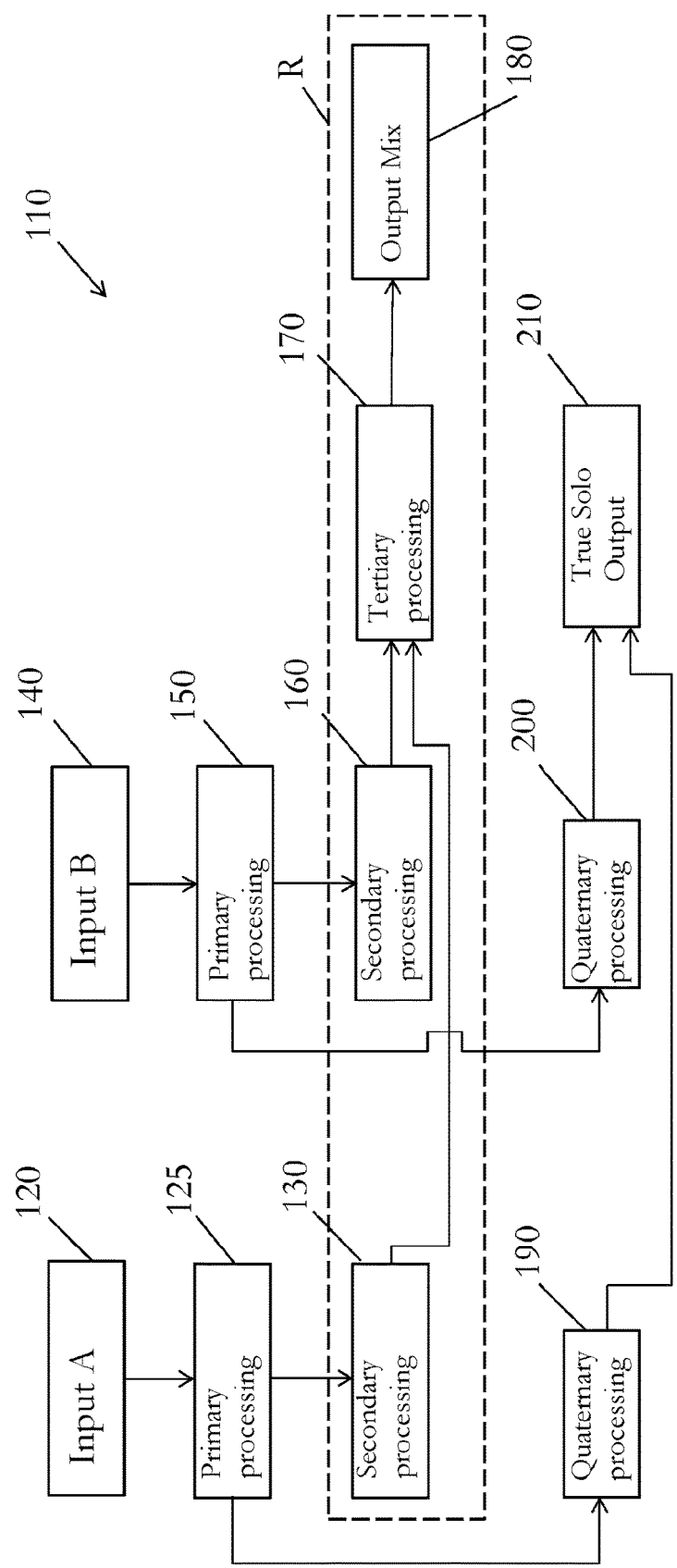
FIG. 2 is a flow diagram indicating the processing steps in a mixing console.

In FIG. 2 a flow of processing steps is indicated 110; the arrows indicating the direction of flow of the signals through the console.

Two input signals A, B are identified each as a column of steps 120, 125, 130; 140, 150, 160. These two columns may be considered as separate input channels. One output channel R is also identified each as a row of steps 130, 160, 170, 180.

In the first input channel a first input signal A is shown in box 120. This may be the output from a performer. In the second input channel a second input signal B is shown in box 140. This may be the output from another different performer. The signals A, B are input to the console.

The first input signal A is then processed in an initial processing step 125 by primary processing means 125. Likewise, the second input signal B is processed by primary processing means in step 150. These processing steps 125, 150 provide a central, over-arching processing of these signals prior to further processing and/or combining.

The output from the initial primary processing step 125 for input signal A is then directed to a secondary processing step 130. Likewise, the output from the initial primary processing step 150 for input signal B is then directed to a secondary processing step 160.

The secondary processing steps may be effected by secondary processing means.

In the output channel R, the output from the secondary processing step 130 of the first input signal A is sent to a tertiary processing step 170 where it is optionally combined with the output from the secondary processing step 160 of the second input signal B. This tertiary processing step 170 may be effected by a tertiary processing means. The overall characteristics of the combined signal may be manipulated. Its gain may be also be manipulated. The resultant output is known as an output mix 180.

In addition to an output from the initial primary processing step 125, for input signal A, being directed to the secondary processing step 130, an additional identical signal is output to a quaternary processing step 190. In this quaternary processing step 190 the signal may be processed in an identical way to that in which the output signal from the primary processing step 125 is processed by the secondary processing step 130 and then subsequently by the tertiary processing step 170. Quaternary processing means effect this quaternary processing. The quaternary processing means may be arranged such that its processing automatically mimics the processing made by the secondary processing step 130 and the tertiary processing step 170.

The output of the quaternary processing step 190 is output as the "True Solo Output" 210. It is this output which the console operator may listen to as desired to more clearly hear the results of all the various processing being made to the input signal A on its own without any other input signal.

Likewise, in addition to an output from the initial primary processing step 150, for input signal B, being directed to the secondary processing step 160, an additional identical signal is output to a quaternary processing step 200. In this quaternary processing step 200 the signal may be processed in an identical way to that in which the output signal from the primary processing step 150 is processed by the secondary processing step 160 and then subsequently by the tertiary processing step 170. Quaternary processing means effect this quaternary processing. The quaternary processing means may be arranged such that its processing automatically mimics the processing made by the secondary processing step 160 and the tertiary processing step 170.

The output of the quaternary processing step 20 is also output as the "True Solo Output" 210. It is this output which the console operator may listen to as desired to more clearly hear the results of all the various processing being made to the input signal B on its own without any other input signal.

The console includes means (not shown) for the operator to be able to switch between input signal A and input signal B as the true solo output at step 210.

In use, if the settings of any of the secondary 130, 160 or tertiary processing means 170 are changed then the settings of the respective quaternary processing means 190, 200 are updated so that they are always synchronised such that the operator will reliably know that he is listening to the correctly processed signals.

It will be understood that there may be more than two input channels and more than one output channel. In the latter situation the console will also include means (not shown) for the operator to select an output channel of interest such that the correct secondary and tertiary processing settings are being applied to create the respective true solo output signal. In this regard the console includes means (not shown) for the quaternary processing means to be automatically and continually updated with the settings from the relevant secondary and tertiary processing means.

It is conceivable that the primary processing steps 125, 150 make no changes to the characteristics of the input signals and that the input signals are merely split into as many identical output signals as is required for the various output channels (plus one for the quaternary processing means).

The secondary processing steps 130, 160 may be known as "nodal processing steps".

Any of the processing described herein may be understood to mean comprising the manipulation (change) of a signals' gain and/or any other characteristic thereof.

The invention claimed is:

1. A mixing console comprising first and second input channels, the first input channel comprising a receiver arranged to receive a first input signal, and a first primary processor arranged to initially process the first input signal and provide at least two first identical output signals; the second input channel comprising a receiver arranged to receive a second input signal, and a second primary processor arranged to initially process the second input signal and provide at least two second identical output signals; the console further comprising at least one output channel comprising at least a first and second secondary processor, the first secondary processor arranged to process the first output signal from the first input channel and produce a first tertiary output signal; the second secondary processor arranged to process the first output signal from the second input channel and produce a second tertiary output signal; the at least one output channel further comprising a tertiary processor arranged to combine and process the first and second tertiary output signals to produce a first output mix; wherein the mixing console further comprises a quaternary processor arranged to receive the second output signal from the first input channel and process it in an identical way to a combination of the processing provided by the first secondary processor and the tertiary processor to provide an operator output signal.

2. The mixing console according to claim 1, wherein either or both of the first and second secondary processors are arranged to only affect the gain of the first and/or second output signals from the first and/or second input channels.

3. The mixing console according to claim 1, wherein either or both of the first and second secondary processors are arranged to affect the gain and other characteristics of the first and/or second output signals from the first and/or second input channels.

4. The mixing console according to claim 1, wherein the quaternary processor is arranged to automatically mimic the combination of the processing provided by the first secondary processor and the tertiary processor.

5. The mixing console according to claim 1, wherein the first output mix is an auxiliary output mix.

6. The mixing console according to claim 1, wherein the first output mix is a master output mix.

7. The mixing console according to claim 1, further comprising a set of controls for arranging the processing by one or more of the first primary processor, the second primary processor, the first secondary processor, the second secondary processor, the tertiary processor, and the quaternary processor.

8. The mixing console of claim 7, wherein the same set of controls is used to vary the arrangement of how each of the processors processes the input and output signals.

9. The mixing console according to claim 1, further comprising a memory for saving and selectively recalling more than one arrangement of any of the processors.

10. The mixing console of claim 1, further comprising a transmitter for transferring the arrangements of any of the processors to any other processor.

11. The mixing console according to claim 1, wherein any or all of the processors are configured to be able to independently, or in combination, apply processes selected from the group including: attenuation; band curve selection; band-pass equalization; boosting; compression; delaying; valve emulation; dual insert points; dynamic equalization; dynamic reshaping; echoing; equalization; fading; four-band parametric equalization; gating; high-pass equalization; high-pass filtration; level fluctuating; levelling; low-pass filtering; low-pass equalization; mixing; notch filter equalization; panning; reshaping; reverberation; shelf equalization; single and multi-channel pre-setting; and summing.

12. The mixing console according to claim 1, further comprising an indicator.

13. The mixing console according to claim 12, wherein the indicator comprises visual indicators and/or audio indicators.

14. The mixing console according to claim 12, wherein the indicator comprises visual indicators and/or audio indicators.

15. The mixing console according to claim 1, wherein the input signals comprise one or more of an instrument, vocals, a sample, a recording and other sound sources.

16. A method of processing an input signal independently of other input signals to produce an operator output signal, comprising the steps of providing a mixing console according to claim 1; transmitting at least a first and second input signal to the console; processing the first input signal with the first primary processor to produce at least two first identical output signals; processing the second input signal with the second primary processor to produce at least two second identical output signals; processing a first output signal from the second input channel to produce a second tertiary output signal; combining and processing the first and second tertiary output signals to produce a first output mix; processing the second output signal from the first input channel in an identical way to a combination of the processing which provided the first output mix, to thereby provide the operator output signal.

* * * * *